United States Patent
Kemmerling

(10) Patent No.: US 8,095,841 B2
(45) Date of Patent: Jan. 10, 2012

(54) METHOD AND APPARATUS FOR TESTING SEMICONDUCTOR DEVICES WITH AUTONOMOUS EXPECTED VALUE GENERATION

(75) Inventor: Todd Ryland Kemmerling, Livermore, CA (US)

(73) Assignee: FormFactor, Inc., Livermore, CA (US)

( * ) Notice: Subject to any disclaimer, the term of this patent is extended or adjusted under 35 U.S.C. 154(b) by 232 days.

(21) Appl. No.: 12/194,517

(22) Filed: Aug. 19, 2008

(65) Prior Publication Data

US 2010/0050029 A1 Feb. 25, 2010

(51) Int. Cl.
- *G01R 31/28* (2006.01)
- *G06F 11/00* (2006.01)
- *G06F 11/08* (2006.01)

(52) U.S. Cl. .................... 714/736; 714/797

(58) Field of Classification Search .................... None
See application file for complete search history.

(56) References Cited

U.S. PATENT DOCUMENTS

| | | | |
|---|---|---|---|
| 3,780,274 A * | 12/1973 | Thompson et al. | 702/117 |
| 3,781,683 A | 12/1973 | Freed | |
| 3,827,820 A | 8/1974 | Hoffman | |
| 4,038,599 A | 7/1977 | Bove et al. | |
| 4,194,113 A * | 3/1980 | Fulks et al. | 714/732 |
| 4,358,847 A * | 11/1982 | Susskind | 714/736 |
| 4,455,654 A | 6/1984 | Bhaskar et al. | |
| 4,468,616 A | 8/1984 | Yoshizaki | |
| 4,523,144 A | 6/1985 | Okubo et al. | |
| 4,658,400 A * | 4/1987 | Brown et al. | 714/736 |
| 4,706,018 A | 11/1987 | Beha et al. | |
| 4,723,242 A * | 2/1988 | Larson et al. | 714/797 |
| 4,780,670 A | 10/1988 | Cherry | |
| 4,837,622 A | 6/1989 | Whann et al. | |
| 4,899,099 A | 2/1990 | Mendenhall | |
| 5,070,297 A | 12/1991 | Kwon | |
| 5,090,118 A | 2/1992 | Kwon et al. | |
| 5,103,557 A | 4/1992 | Leedy | |
| 5,148,103 A | 9/1992 | Pasiecznik, Jr. | |
| 5,162,728 A | 11/1992 | Huppenthal | |
| 5,172,050 A | 12/1992 | Swapp | |
| 5,187,020 A | 2/1993 | Kwon et al. | |
| 5,191,708 A | 3/1993 | Kasukabe et al. | |
| 5,243,274 A | 9/1993 | Kelsey et al. | |
| 5,261,155 A | 11/1993 | Angulas et al. | |
| 5,323,107 A | 6/1994 | D'Souza | |
| 5,357,523 A | 10/1994 | Bogholtz, Jr. et al. | |
| 5,363,038 A | 11/1994 | Love | |
| 5,367,254 A | 11/1994 | Faure et al. | |
| 5,389,556 A | 2/1995 | Rostoker et al. | |
| 5,406,210 A | 4/1995 | Pedder | |

(Continued)

FOREIGN PATENT DOCUMENTS

DE 9004562 8/1990

(Continued)

*Primary Examiner* — Jeffrey A Gaffin
*Assistant Examiner* — Guerrier Merant
(74) *Attorney, Agent, or Firm* — Kirton & McConkie

(57) ABSTRACT

Method and apparatus for testing semiconductor devices with autonomous expected value generation is described. Examples of the invention can relate to apparatus for interfacing a tester and a semiconductor device under test (DUT). An apparatus can include output processing logic configured to receive test result signals from the DUT responsive to testing by the tester, the output processing logic voting a logic value of a majority of the test result signals as a correct logic value; and memory configured to store indications of whether each of the test result signals has the correct logic value.

30 Claims, 7 Drawing Sheets

U.S. PATENT DOCUMENTS

| | | |
|---|---|---|
| 5,422,574 A | 6/1995 | Kister |
| 5,434,513 A | 7/1995 | Fujii et al. |
| 5,442,282 A | 8/1995 | Rostoker et al. |
| 5,476,211 A | 12/1995 | Khandros |
| 5,479,105 A | 12/1995 | Kim et al. |
| 5,491,426 A | 2/1996 | Small |
| 5,495,667 A | 3/1996 | Farnworth et al. |
| 5,497,079 A | 3/1996 | Yamada et al. |
| 5,532,610 A | 7/1996 | Tsujide et al. |
| 5,534,784 A | 7/1996 | Lum et al. |
| 5,568,054 A | 10/1996 | Lino et al. |
| 5,570,032 A | 10/1996 | Atkines et al. |
| 5,600,257 A | 2/1997 | Leas et al. |
| 5,625,297 A | 4/1997 | Arnaudov et al. |
| 5,642,054 A | 6/1997 | Pasiecznik, Jr. |
| 5,648,661 A | 7/1997 | Rostoker et al. |
| 5,669,774 A | 9/1997 | Grabbe |
| 5,670,889 A | 9/1997 | Okubo et al. |
| 5,686,842 A | 11/1997 | Lee |
| 5,701,085 A | 12/1997 | Malladi et al. |
| 5,701,666 A | 12/1997 | DeHaven et al. |
| 5,736,850 A | 4/1998 | Legal |
| 5,764,072 A | 6/1998 | Kister |
| 5,772,451 A | 6/1998 | Dozier, II et al. |
| 5,806,181 A | 9/1998 | Khandros et al. |
| 5,821,763 A | 10/1998 | Beaman et al. |
| 5,829,128 A | 11/1998 | Eldridge et al. |
| 5,832,601 A | 11/1998 | Eldridge et al. |
| 5,834,946 A | 11/1998 | Albrow et al. |
| 5,838,163 A | 11/1998 | Rostoker et al. |
| 5,864,946 A | 2/1999 | Eldridge et al. |
| 5,878,486 A | 3/1999 | Eldridge et al. |
| 5,884,398 A | 3/1999 | Eldridge et al. |
| 5,897,326 A | 4/1999 | Eldridge et al. |
| 5,900,738 A | 5/1999 | Khandros et al. |
| 5,917,707 A | 6/1999 | Khandros et al. |
| 5,974,662 A | 11/1999 | Eldridge et al. |
| 5,983,493 A | 11/1999 | Eldridge et al. |
| 5,998,228 A | 12/1999 | Eldridge et al. |
| 6,029,344 A | 2/2000 | Khandros et al. |
| 6,032,356 A | 3/2000 | Eldridge et al. |
| 6,059,982 A | 5/2000 | Palagonia et al. |
| 6,064,213 A | 5/2000 | Khandros et al. |
| 6,110,823 A | 8/2000 | Eldridge et al. |
| 6,133,744 A | 10/2000 | Yojima et al. |
| 6,174,744 B1 | 1/2001 | Watanabe et al. |
| 6,219,908 B1 | 4/2001 | Farnworth et al. |
| 6,275,051 B1 | 8/2001 | Bachelder et al. |
| 6,316,988 B1 | 11/2001 | Forehand et al. |
| 6,525,555 B1 | 2/2003 | Khandros et al. |
| 6,535,555 B1 | 3/2003 | Bordes et al. |
| 6,655,023 B1 | 12/2003 | Eldridge et al. |
| 6,788,094 B2 | 9/2004 | Khandros et al. |
| 6,856,150 B2 | 2/2005 | Sporck et al. |
| 7,078,926 B2 | 7/2006 | Khandros et al. |
| 7,116,119 B2 | 10/2006 | Sporck et al. |
| 7,200,822 B1 * | 4/2007 | McElvain ............ 716/3 |
| 7,240,264 B2 * | 7/2007 | Gearhardt et al. ........... 714/726 |
| 7,307,433 B2 | 12/2007 | Miller et al. |
| 7,345,493 B2 | 3/2008 | Khandros et al. |
| 7,555,690 B1 * | 6/2009 | Yang et al. ........... 714/742 |
| 7,669,100 B2 * | 2/2010 | Pelley ............. 714/732 |
| 2003/0076125 A1 * | 4/2003 | McCord ............ 324/765 |
| 2003/0079165 A1 * | 4/2003 | Ffrench et al. ............ 714/726 |
| 2003/0107394 A1 | 6/2003 | Khandros et al. |
| 2003/0234659 A1 * | 12/2003 | Zieleman ............ 324/765 |
| 2004/0068869 A1 | 4/2004 | Eldridge et al. |
| 2008/0220545 A1 * | 9/2008 | Pelley ............. 438/14 |

FOREIGN PATENT DOCUMENTS

| | | |
|---|---|---|
| EP | 047141 | 3/1982 |
| EP | 699912 | 3/1996 |
| EP | 708338 | 4/1996 |
| FR | 2645679 | 10/1990 |
| JP | 02-159585 | 6/1990 |
| JP | 06-180342 | 6/1994 |
| JP | 07-111283 | 4/1995 |
| JP | 08-37215 | 2/1996 |
| JP | 08-50162 | 2/1996 |
| JP | 08/129053 | 5/1996 |
| JP | 08-184612 | 7/1996 |
| WO | 91/12706 | 8/1991 |
| WO | 95/14314 | 5/1995 |
| WO | 96/08056 | 3/1996 |
| WO | 96-15459 | 5/1996 |
| WO | 98-01906 | 1/1998 |

* cited by examiner

METHOD AND APPARATUS FOR TESTING SEMICONDUCTOR DEVICES WITH AUTONOMOUS EXPECTED VALUE GENERATION

BACKGROUND OF THE INVENTION

1. Field of the Invention

Embodiments of the present invention relate to semiconductor testing.

2. Description of the Related Art

Testing is an important step in the production of semiconductor devices for use. Typically, partially or fully completed semiconductor devices may be tested by bringing terminals disposed on an upper surface of a device to be tested—also referred to as a device under test (or DUT)—into contact with resilient contact elements, for example, as contained in a probe card assembly, as part of a test system. A test system controller may be coupled to the probe card assembly to send and receive test signals to and from the DUTs over a set of test channels. A test system controller with increased test channels can be a significant cost factor for a test system. Test system controllers have evolved to increase the number of channels and hence the number of devices that can be tested in parallel (sometimes referred to as multi-site testing).

One technique to accommodate testing of components on a wafer with a limited number of test channels is to fan out a signal from a test system controller in the probe card assembly to multiple transmission lines. That is, a test signal normally provided to a single DUT can be fanned out to multiple DUTs in the probe card assembly. This technique can enable testing of an increased number of DUTs during a single touchdown for a fixed number of test system channels.

During testing, some test channels provide inputs to input pins of the DUTs, others test channels monitor for outputs from output pins of the DUTs, and still others provide inputs to and monitor for outputs from input/output (IO) pins of the DUTs. In addition, some channels are used to provide expected result data (expected outputs) used to verify outputs of the DUTs. For a functional DUT, the outputs match the expected outputs. If any output from a DUT does not match its expected output, an indication of a failure for that DUT can be generated. Utilizing test channels to pass expected result data, however, reduces the number of test channels available to pass input/output signals to/from the DUTs. A limit on the number of input/output signals used for testing can affect the number and types of DUTs capable of being tested by the system, can increase test time, and can increase test cost.

Accordingly, there exists a need in the art for a method and apparatus for testing semiconductor devices that attempts to overcome at least some of the aforementioned deficiencies.

SUMMARY OF THE INVENTION

Embodiments of the invention can relate to apparatus for interfacing a tester and a semiconductor device under test (DUT). In some embodiments, an apparatus can include output processing logic configured to receive test result signals from the DUT responsive to testing by the tester, the output processing logic voting a logic value of a majority of the test result signals as a correct logic value; and memory configured to store indications of whether each of the test result signals has the correct logic value.

Embodiments of the invention relate to a test system for testing a semiconductor device under test (DUT). In some embodiments, the test system includes test instruments having a tester; a probe card assembly having test probes configured to contact devices on the DUT; output processing logic configured to receive test result signals from groups of pins of the DUT responsive to testing by the tester, the output processing logic configured to, for each group of the pins, vote a logic value of a majority of the test result signals on such group of pins as a correct logic value; and memory configured to store indications, for each group of the pins, of whether each of the test result signals on such group of pins has the correct logic value.

Embodiments of the invention relate to a method of testing a semiconductor device under test (DUT). In some embodiments, the method can include providing a test signal to a plurality of devices on the DUT; capturing values of test result signals generated by the devices on the DUT; voting a logic value of a majority of the test result signals as a correct logic value; comparing each of the values of the test result signals with the correct logic value; and storing indications of whether each of the test result signals has the correct logic value in a memory.

Embodiments of the invention relate to a probe card assembly. In some embodiments, the probe card assembly can include: test probes configured to contact one or more devices on a semiconductor device under test (DUT); output processing logic configured to receive test result signals from groups of pins of the DUT responsive to testing, the output processing logic configured to vote a logic value of a majority of the test result signals for each group of the pins as a correct logic value; and memory configured to store indications of whether each of the test result signals for each group of the pins has the correct logic value.

BRIEF DESCRIPTION OF THE DRAWINGS

So that the manner in which features of the various embodiments of the present invention can be understood in detail, a more particular description of the invention, briefly summarized above and described more fully below, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Where possible, identical reference numerals are used herein to designate identical elements that are common to the figures. The images used in the drawings are simplified for illustrative purposes and are not necessarily depicted to scale.

DETAILED DESCRIPTION

This specification describes exemplary embodiments and applications of the invention. The invention, however, is not limited to these exemplary embodiments and applications or to the manner in which the exemplary embodiments and applications operate or are described herein. Moreover, the Figures may show simplified or partial views, and the dimensions of elements in the Figures may be exaggerated or otherwise not in proportion for clarity. In addition, as the terms "on" and "attached to" are used herein, one object (e.g., a material, a layer, a substrate, etc.) can be "on" or "attached to" another object regardless of whether the one object is directly on or attached to the other object or there are one or more intervening objects between the one object and the other object. Also, directions (e.g., above, below, top, bottom, side, up, down, "x," "y," "z," etc.), if provided, are relative and provided solely by way of example and for ease of illustration and discussion and not by way of limitation. In addition, where reference is made to a list of elements (e.g., elements a, b, c), such reference is intended to include any one of the listed elements by itself, any combination of less than all of the listed elements, and/or a combination of all of the listed elements.

The present invention provides a method and apparatus for testing semiconductor devices with autonomous expected value generation. Aspects of the invention can relate to capturing values of test result signals produced by devices on a device under test (DUT) in response to testing. A correct logic value can be derived from the test result signals. In some embodiments, a logic value of a majority of the test result signals can be voted as the correct logic value. Values of the test result signals can be compared with the correct logic value and indications of whether the test result signals have the correct value (expected value) can be stored in a memory. This process can be duplicated for test result signals obtained for various groups of pins on the DUT. For example, test resource extension (TRE) circuits can be provided each of which drive a test signal to a group of pins on the DUT (e.g., a similar pin on each of the devices). The TRE circuits can include voting logic configured to implement the voting process. In this manner, expected values for the test result signals are generated autonomously from the test result signals, rather than being provided by a tester or other source.

Figure 1:
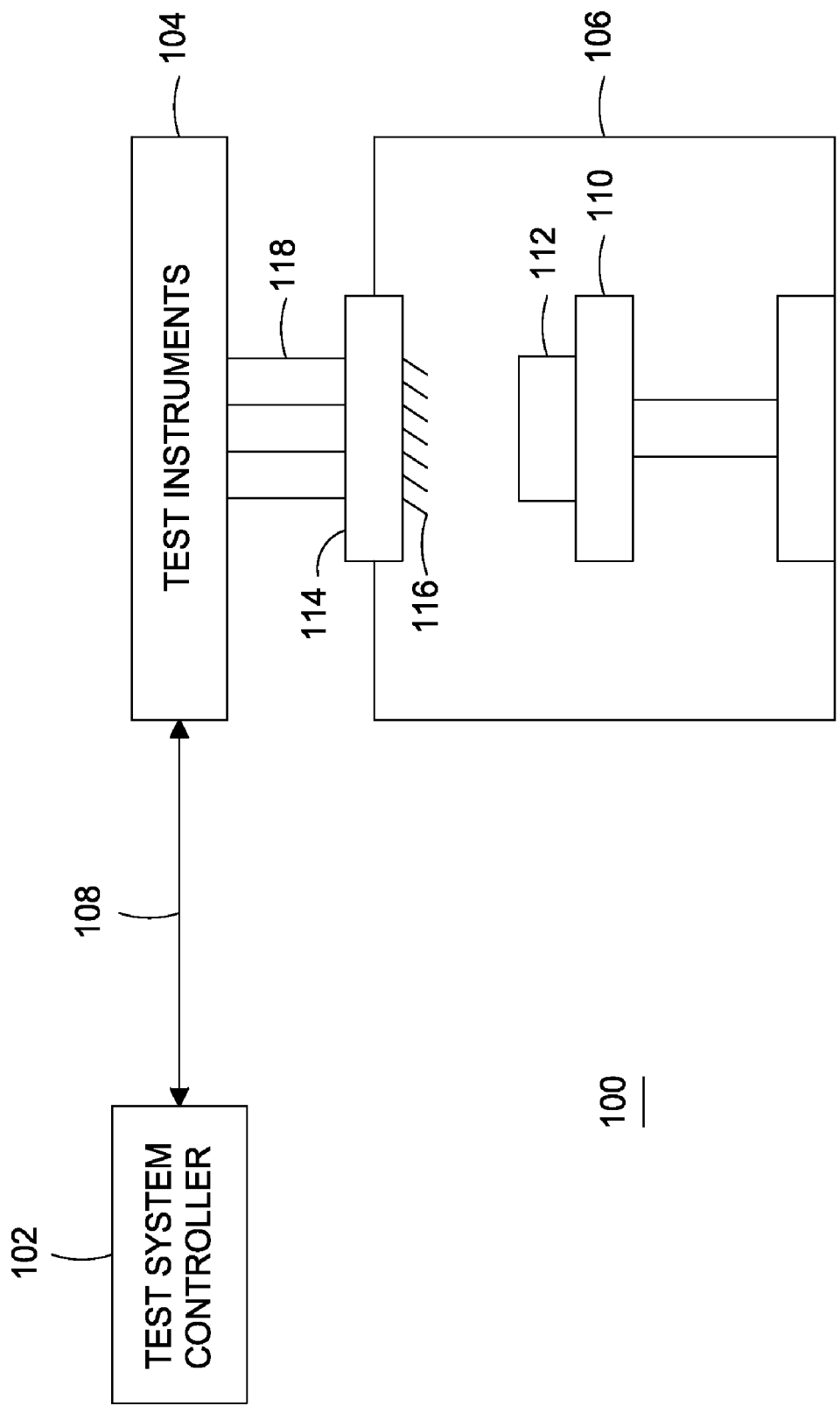
FIG. 1 depicts a test system according to some embodiments of the invention.

FIG. 1 depicts a test system 100 according to some embodiments of the invention. The test system 100 can generally include a test system controller 102, test instruments 104, a probe card assembly 114, and a prober 106. The test system controller 102 can be coupled to the test instruments 104 by a communication link 108. The test system controller 102 may comprise a host computer, for example. The prober 106 can include a stage 110 for mounting a device under test (DUT) 112 being tested. The DUT 112 can be any electronic device or devices to be tested. Non-limiting examples of a suitable DUT include one or more dies of an unsingulated semiconductor wafer, one or more semiconductor dies singulated from a wafer (packaged or unpackaged), an array of singulated semiconductor dies disposed in a carrier or other holding device, one or more multi-die electronics modules, one or more printed circuit boards, or any other type of electronic device or devices. The term DUT, as used herein, can refer to one or a plurality of such electronic devices. The probe card assembly 114 can include probes 116 (also referred to as test probes) that contact the DUT 112. The stage 110 can be movable to contact the DUT 112 with probes 116.

In the test system 100, test data can be generated by the test instruments 104 and transmitted through the probe card assembly 114, the probes 116, and ultimately to the DUT 112. Overall control of the test instruments 104 for testing may be orchestrated by the test system controller 102 (e.g., a general purpose computer). Test results can then be provided from the DUT 112 back through the probe card assembly 114 to the test instruments 104. The test instruments 104 may transmit the test results to the test system controller 102 for analysis.

Test data provided from the test instruments 104 can be divided into individual test channels. The test channels can be linked by connectors 118 to the probe card assembly 114. The connectors 118 may be any suitable connectors, such as flexible cable connectors, pogo pins, zero insertion force (ZIF) connectors, or the like. The probe card assembly 114 can fan out one or more of the test channels to multiple probes 116.

Figure 7:
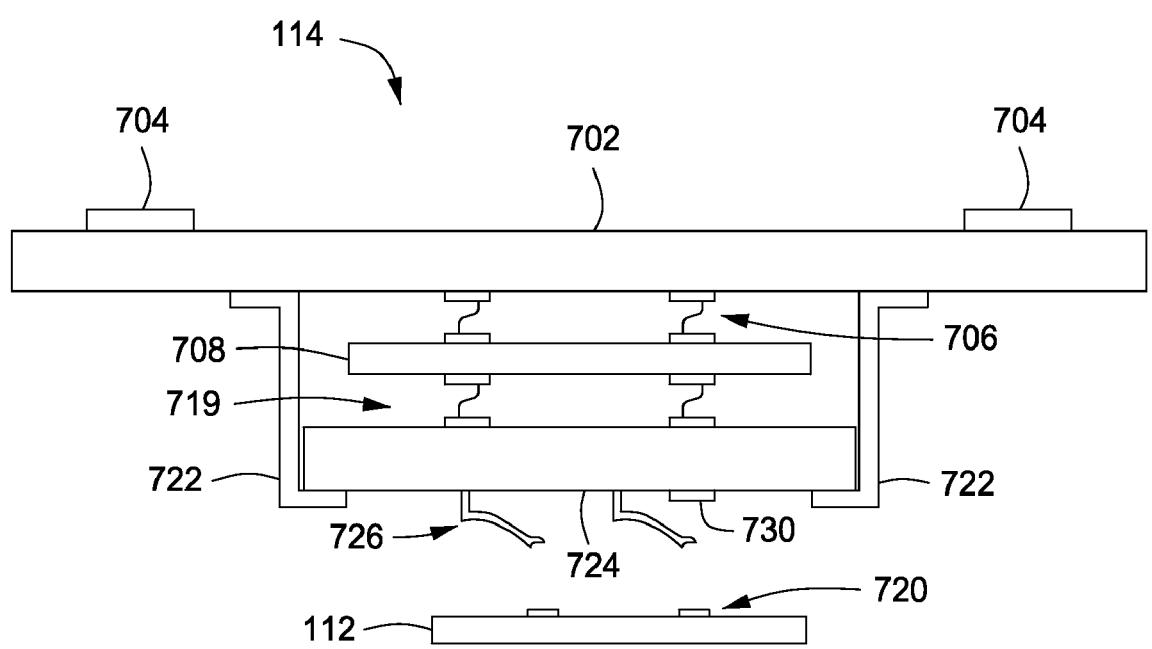
FIG. 7 depicts a probe card assembly according to some embodiments of the invention.

FIG. 7 depicts the probe card assembly 114 according to some embodiments of the invention. The probe card assembly 114 generally acts as an interface between the test instruments 104 and the DUT 112. The probe card assembly 114 can include electrical connectors 704 configured to make electrical connections with a plurality of test channels from the test instruments 104. The probe card assembly 114 can also include one or more resilient contact elements 726 as test probes. The resilient contact elements 726 can be configured to be pressed against, and thus make temporary electrical connections with, one or more input and/or output terminals 720 of the DUT 112. The resilient contact elements 726 are typically configured to correspond to desired terminals 720 of the DUT 112 and may be arranged in one or more arrays having a desired geometry.

The probe card assembly 114 may include one or more substrates configured to support the connectors 704 and the resilient contact elements 726 and to provide electrical connections therebetween. The exemplary probe card assembly 114 shown in FIG. 7 has three such substrates, although in other implementations, the probe card assembly 114 can have more or fewer substrates. In the embodiment depicted in FIG. 7, the probe card assembly 114 includes a wiring substrate 702 (also referred to as a printed wiring board), an interposer substrate 708, and a probe substrate 724 (also referred to as a probe head). The wiring substrate 702, the interposer substrate 708, and the probe substrate 724 can generally be made of any type of suitable material or materials, such as, without limitation, printed circuit boards, ceramics, organic or inorganic materials, and the like, or combinations thereof.

Additionally, the probe card assembly 114 may include one or more active or passive electronic components (such as capacitors, resistors, and the like). In some embodiments, electronics 730 can be disposed on the wiring substrate 702. The electronics 730 may be used, among other things, to process output of the DUT 112 in response to testing, as described in embodiments below. In other embodiments, the electronics 730 may be disposed on the interposer 708. In still other embodiments, the electronics 730 may be disposed on the probe substrate 724 along with the resilient contact elements 726. In other embodiments, the electronics 730 can be disposed on any combination of one or more of the wiring substrate 702, the interposer substrate 708, and the probe substrate 724.

Electrically conductive paths (examples shown below) are typically provided from the connectors 704 through the various substrates and the electronics 730 to the resilient contact elements 726. For example, in the embodiment depicted in FIG. 7, electrically conductive paths may be provided from the connectors 704 through the wiring substrate 702 to a plurality of electrically conductive spring interconnect structures 706. Other electrically conductive paths may be provided from the spring interconnect structures 706 through the interposer substrate 708 to a plurality of electrically conductive spring interconnect structures 719. Still other electrically conductive paths may further be provided from the spring interconnect structures 719 through the probe substrate 724 to the resilient contact elements 726. The electrically conductive paths through the wiring substrate 702, the interposer substrate 708, and the probe substrate 724 can comprise electrically conductive vias, traces, or the like, that may be disposed on, within, and/or through the wiring substrate 702, the interposer substrate 708, and the probe substrate 724. The electronics 230 can be provided on one or more of the wiring substrate 702, the interposer substrate 708, and/or the probe substrate 724 in the path of at least some of the aforementioned electrically conductive paths, as described in embodiments below.

The wiring substrate 702, the interposer substrate 708, and the probe substrate 724 may be held together by one or more brackets 722 and/or other suitable devices (such as by bolts, screws, or other suitable fasteners). The configuration of the probe card assembly 114 shown in FIG. 7 is exemplary only and is simplified for ease of illustration and discussion and many variations, modifications, and additions are contemplated. For example, a probe card assembly may have fewer or more substrates (e.g., 702, 708, 724) than the probe card assembly 114 shown in FIG. 7. As another example, a probe card assembly may have more than one probe substrate (e.g., 724), and each such probe substrate may be independently adjustable. Non-limiting examples of probe card assemblies with multiple probe substrates are disclosed in U.S. patent application Ser. No. 11/165,833, filed Jun. 24, 2005. Additional non-limiting examples of probe card assemblies are illustrated in U.S. Pat. No. 5,974,662, issued Nov. 2, 1999 and U.S. Pat. No. 6,509,751, issued Jan. 21, 2003, as well as in the aforementioned U.S. patent application Ser. No. 11/165,833. It is contemplated that various features of the probe card assemblies described in those patents and application may be implemented in the probe card assembly 114 shown in FIG. 7 and that the probe card assemblies described in the aforementioned patents and application may benefit from the use of the inventive test logic and its configurations described herein.

Figure 2:
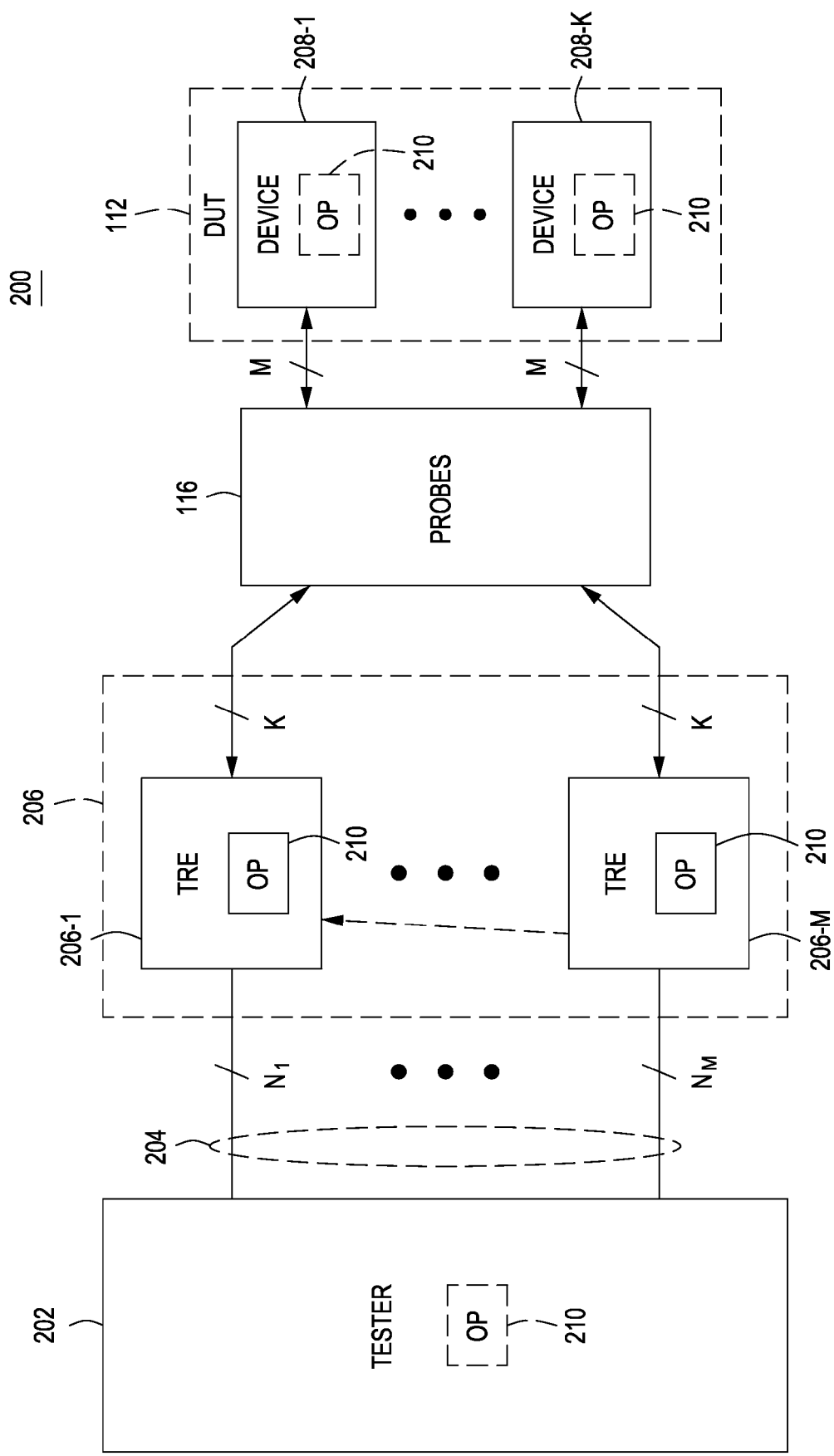
FIG. 2 is a block diagram depicting test logic of the test system of FIG. 1 according to some embodiments of the invention.

FIG. 2 is a block diagram depicting test logic 200 of the test system 100 according to some embodiments of the invention. The test logic 200 can include a tester 202 coupled to a set of test resource extension (TRE) circuits 206 through test channels 204. The set of TRE circuits 206 can include a plurality of TRE circuits 206-1 through 206-M. The tester 202 can be coupled to each of the TRE circuits 206-1 through 206-M by one or more of the test channels 204. As described more fully below, it is not necessary that the tester 202 be coupled to each of the individual TRE circuits 206-1 through 206-M by the same number of the test channels 204. Thus, the tester 202 is shown in FIG. 2 as being coupled to the TRE circuits 206-1 through 206-M by a respective $N_1$ through $N_M$ of the test channels 204, where $N_1$ through $N_M$ are each an integer greater than one (and not necessarily the same).

In an exemplary embodiment, the DUT 112 can include a plurality of devices 208-1 through 208-K. Each of the devices 208-1 through 208-K can include M input/output (IO) pins. Each of the TRE circuits 206-1 through 206-M can include K IO terminals. The K IO terminals of each of the TRE circuits 206-1 through 206-M can be coupled to a respective K test probes 116 of the probe card assembly 114. During testing, the K IO terminals of the TRE circuit 206-1 are coupled to a first IO pin of the devices 208-1 through 208-K, the K IO terminals of the TRE circuit 206-2 are coupled to a second IO pin of the devices 208-1 through 208-K, and so on until the K IO terminals of the TRE circuit 206-M are coupled to an Mth IO pin of the devices 208-1 through 208-K. In general, each of the TRE circuits 206-1 through 206-M can interface with a group of pins on the DUT 112. The group of pins can include a similar pin across the devices 208. In the present example, there are M groups of pins interfacing the M TRE circuits, where each group includes K pins.

During a test, the tester 202 can generate M test signals to be applied to the M IO pins of each of the devices 208-1 through 208-K. The tester 202 can provide each of the M test signals to the TRE circuits 206-1 through 206-M, respectively, through M of the test channels 204. Each of the TRE circuits 206-1 through 206-M can fan out its respective test signal among its K IO terminals. In this manner, the M test signals respectively generated for M IO pins can be fanned out among the K devices 208. Thereafter, the devices 208-1 through 208-K can generate test result signals responsive to the test signals. Each of the TRE circuits 206-1 through 206-M can receive a test result signal from each of the devices 208-1 through 208-K.

The test logic 200 can include output processing (OP) logic 210. In some embodiments, each of the TRE circuits 206-1 through 206-M includes the OP logic 210. For each TRE circuit 206-1 through 206-M, the OP logic 210 can process test result signals received from a particular pin of the devices 208-1 through 208-K to determine if any of the devices 208-1 through 208-K have a failure on that pin. To determine failures, the OP logic 210 can derive an expected value for the particular pin across the devices 208-1 through 208-K. In some embodiments, the OP logic 210 can implement a voting process to establish an expected value for the particular pin across the devices 208-1 through 208-K. The OP logic 210 can vote a logic value of the majority of the test result signals as a correct logic value (also referred to as the expected logic value). If the logic value of a test result signal produced by a device is different than the voted correct logic value, than the OP logic 210 can indicate a failure of that device (on the particular pin being analyzed). In this manner, the test logic 200 does not have to provide expected values to the TRE circuits 206-1 through 206-M for comparison with the test result signals. Rather, the TRE circuits 206-1 through 206-M can determine the correct expected values autonomously from the test result signals.

For purposes of clarity by example, embodiments described herein assume that each of the M IO pins of each of the devices 208 can be input/output pins that receive a test input signal and produce a test result signal. Such example is non-limiting. In some embodiments, one or more of the IO pins of the devices 208 can be input pins that only receive test input signals. In such embodiments, one or more TRE circuits 206 can be provided without output processing logic 210 or with the output processing logic 210 disabled or otherwise unused. In some embodiments, one or more of the IO pins of the devices 208 can be output pins that only produce test result signals. In such embodiments, one or more TRE circuits 206 can be provided without a connection to a test channel 204 for receiving test signals from the tester 202 or the input from such a test channel 204 can be disabled or otherwise unused. Furthermore, for purposes of exposition, embodiments described herein assume that test signals can be applied to the DUT 112 followed sequentially by processing of test result signals. It is to be understood that, in some embodiments, the application of one or more test signals can occur concurrently with the receipt of one or more test result signals.

In some embodiments, each TRE circuit 206-1 through 206-M can upload error data to the tester 202. The error data can include indications as to which of the devices 208-1 through 208-K have failed on a specific pin (generally referred to as indications). The tester 202 can be coupled to each TRE circuit 206-1 through 206-M through at least one of the test channels 204 to receive the error data. That is, the tester 202 can be coupled to each of the TRE circuits 206-1 through 206-M through a plurality of the test channels 204, one for providing a test signal and at least one for receiving error data. In some embodiments, the error data can be returned to the tester 202 in parallel, for example, one signal for each of the K devices 208. This would require K test channels 204 between the tester 202 and each TRE circuit 206. In order to conserve test channels, in some embodiments, each TRE circuit 206 may include memory for storing the error data. In such embodiment, the tester 202 may access the memory using less test channels 204 than there are devices 208 (e.g., one test channel in case of serial transmission).

In some embodiments, the tester 202 can be coupled to each of the TRE circuits 206-1 through 206-M through one of the test channels 204 to provide a control signal. That is, the tester 202 can be coupled to each of the TRE circuits 206-1 through 206-M through three of the test channels 204, one for providing a test signal, at least one for receiving error data, and one for providing the control signal. The control signal can be used to instruct each of the TRE circuits 206-1 through 206-M to read and process the respective test result signals from the DUT 112. In some embodiments, a separate test channel 204 for the control signal between the tester 202 and each of the TRE circuits 206-1 through 206-M is omitted and the control signal can be provided using the test channel that provides the test signal. That is, a particular test channel can be used for both providing test and control signals to a TRE circuit 206.

In some embodiments, the tester 202 does not receive error data directly from each of the TRE circuits 206-1 through 206-M via test channel(s) 204. Rather, one or more of the TRE circuits 206-1 through 206-M can be designated as a "master" TRE circuit, which communicates error data to the tester 202. That is, each of the TRE circuits 206-1 through 206-M can perform the voting and error detection process as described above using the OP logic 210. Assume for purposes of clarity that the TRE circuit 206-1 is the one and only master TRE circuit. Each of the other TRE circuits 206-2 through 206-M can communicate their error data to the TRE circuit 206-1. The TRE circuit 206-1 can then combine the individual error data to produce a combined error data for all pins of each of the devices 208-1 through 208-K. In such an example, error data for individual pins on each device is lost in favor of preserving test channels between the TRE logic 206 and the tester 202. That is, in such an example, only K or less test channels can be provided to handle the upload of error data from the TRE logic 206 to the tester 202. Any number of master TRE circuits can be designated, which allows for more or less localization of error data with respect to the IO pins of the devices 208, while requiring more or less test channels to upload the error data. In some embodiments, rather than implementing master TRE circuits, logic for combining individual error data from the TRE circuits 206-1 through 206-M can be implemented separately (i.e., as a separate logic block or blocks).

In some embodiments, the number of the test channels 204 that are coupled to the TRE circuits 206 is reduced as compared to a tester that provides expected values to the TRE circuits without implementing autonomous expected value generation. For example, the tester 202 does not require dedicated test channels for providing expected values to the TRE circuits 206, since such expected values are autonomously generated. In addition, as described above, the TRE circuits 206 can be coupled to various numbers of test channels for returning error data to the tester. In some embodiments, the error data returned to the tester 202 comprises less data than the raw test result signals received from the DUT 112 so as to reduce the number of test channels coupled to the tester 202. For example, as noted above, each TRE circuit 206 can be coupled to the tester 202 using less of the test channels 204 than there are devices 208 (i.e., less than K), and/or the TRE circuits 206 can be coupled to the tester 202 using less test channels 204 than there are test signals/TRE circuits 206 (i.e., less than M).

In some embodiments, the tester 202 can be implemented using electronics in the test instruments 104, the TRE logic 206 can be implemented using electronics on the probe card assembly 114 (e.g., the electronics 730), and the test channels 204 can be implemented using signal paths (and sometimes electronics) on the probe card assembly 114. In some embodiments, the OP logic 210 can be contained within the TRE circuits 206-1 through 206-M. In some embodiments, the OP logic 210 can be distributed. For example, a portion of the OP logic 210 can be implemented on the devices 208 (i.e., in the dicing streets of the DUT 112 between the devices 208), while another portion of the OP logic 210 is implemented in the TRE logic 206. In another example, a portion of the OP logic 210 can be implemented in the tester 202, while another portion is implemented in the TRE logic 206 and/or the DUT 112.

Figure 3:
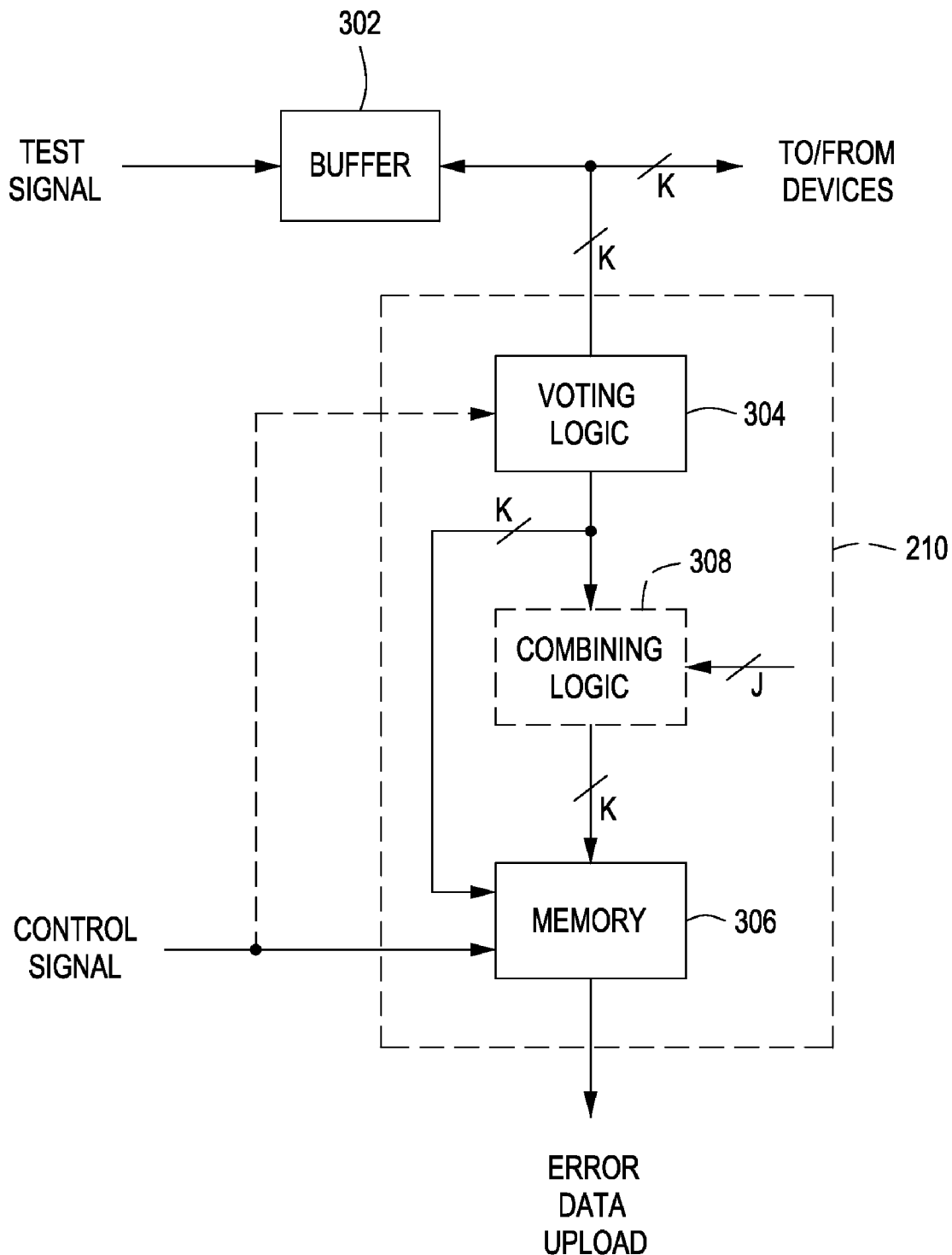
FIG. 3 is a block diagram depicting a test resource extension (TRE) circuit according to some embodiments of the invention.

FIG. 3 is a block diagram depicting a TRE circuit 206 according to some embodiments of the invention. In some embodiments, the TRE circuit 206 can include a buffer 302, voting logic 304, and a memory 306. The voting logic 304 and the memory 306 can comprise the OP logic 210. The buffer 302 can be configured to receive a test signal from the tester 202 (e.g., via a test channel 204). The buffer 302 can fan out the test signal among K IO terminals that are configured for communication with a specific pin of the devices 208-1 through 208-K. An input interface of the voting logic 304 can be coupled to the K IO terminals of the buffer 302. In this manner, the voting logic 304 can receive test result signals from the specific pin on each of the devices 208-1 through 208-K.

The voting logic 304 can comprise combinatorial logic configured to implement a voting process, as described above. That is, the voting logic 304 can vote a logic value of a majority of the K test result signals as a correct logic value, and compare each of the K test result signals against the correct logic value as voted. The voting logic 304 can indicate a failure on the specific pin for any of the devices 208-1 through 208-K if the corresponding test result signal does not have the correct logic value. Thus, the voting logic 304 can produce K output values, each indicating whether the particular pin on a respective one of the K devices has failed. An exemplary non-limiting embodiment of the voting logic 304 is described below.

In order to accurately determine the correct logic value for the test result signals, at least 51% of the devices producing the test result signals being processed should be operable (non-failing). Stated differently, if more than 50% of the devices producing the test result signals being processed had the same defect, then the voting logic 304 will not produce accurate error data for the particular pin during this particular test cycle. The more test result signals processed by the voting logic 304 (i.e., the larger K is), the more accurately the voting logic 304 can determine the correct logic value of the test result signals. Also, even if inaccurate error data is produced for the particular pin during this particular test cycle, the devices are typically tested with a large number of test signals (e.g., on the order of millions of test signals), so the probability of a failing device escaping detection can be statistically insignificant.

In some embodiments, the memory 306 can receive the K output values produced by the voting logic 304. The memory 306 can have a depth greater than one, such that more than one set of K output values from the voting logic 304 can be stored. The memory 306 can be responsive to a control signal. The control signal can be produced by the tester 202 and received over a separate test channel or via the test channel that provides the test signal. The control signal can cause the memory to latch the K output values of the voting logic 304. For example, the memory 306 can include K registers having input ports coupled to the voting logic 304 and clock ports coupled to receive the control signal. If the depth of the memory 306 is greater than one, the control signal can further cause a shift forward of sets of K output values. For example, the memory 306 can include K first-in-first-out (FIFO) memories having input ports coupled to the voting logic 304 and control ports coupled to receive the control signal. The control signal could cause a push/pop operation on each of the FIFOs.

An output of the memory 306 can be configured to provide error data for upload to the tester 202. The memory 306 can be coupled to one or more test channels for providing the error data. In some embodiments, the memory 306 can provide a parallel output, for example, K outputs for providing the error data, which would require K test channels. Alternatively, the memory 306 can provide less than K outputs, such as a single output configured for serial transmission of the error data. In such embodiments, the memory 306 includes logic for buffering the output data. Also, in such embodiments, the tester 202 can read the memory 306 at a speed slower than that at which the test signals are applied to the DUT 112. This reduces the number of test channels required for upload of the error data. The memory 306 should be configured to have sufficient capacity to store new error data produced by testing as the older error data is uploaded to the tester 202. Although exemplary structures for the memory 306 have been described, other structures may be employed in order to achieve the functionality described above.

In some embodiments, the voting logic 304 may include synchronous logic elements that require the control signal to operate. For example, the voting logic 304 may include K latches for latching the logic values on the K IO terminals during processing of the test result signals.

In some embodiments, the TRE circuit 206 includes combining logic 308. The combining logic 308 can be coupled to receive the K output signals produced by the voting logic 304, as well as J sets of K output signals produced by J other TRE circuits 206 (J being an integer greater than zero). The combining logic 308 can effectively combine error data for a plurality of pins across the devices 208. The combining logic 308 can produce K outputs, one for each device, where each output indicates error status collectively for a plurality of pins. The memory 306 can then operate as described above. The combining logic 308 can comprise combinatorial logic configured to implement the functional herein described. An exemplary non-limiting embodiment of the combining logic 308 is described below. Although the combining logic 308 is shown as being completely in the TRE circuit 206, the combining logic 308 can be implemented as a separate logic block or distributed among the TRE circuits 206-1 through 206-M.

Figure 4:
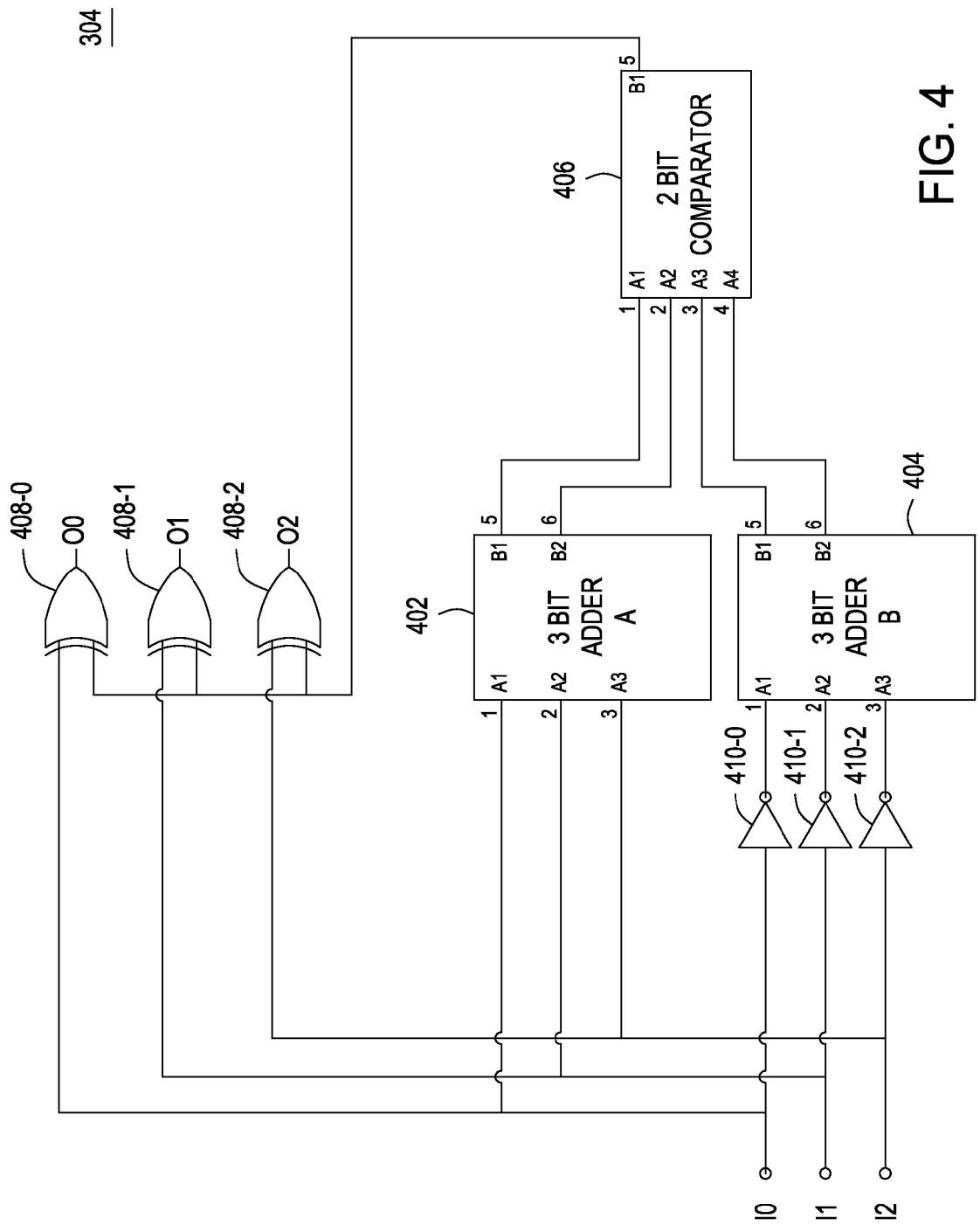
FIG. 4 is a block diagram depicting voting logic according to some embodiments of the invention.

FIG. 4 is a block diagram depicting the voting logic 304 according to some embodiments of the invention. For purposes of clarity by example, the voting logic 304 receives three test result signals for a particular pin on three DUT devices. The three test result signals are designated I0, I1, and I2. Likewise, the voting logic 304 produces three output signals indicating error status for the three test result signals, designated O0, O1, and O2. The configuration depicted in FIG. 4 is illustrative and the voting logic 304 may process more than three test result signals and the logic shown can be adjusted accordingly.

In the present non-limiting embodiment, the voting logic 304 can include an adder 402, an adder 404, a comparator 406, exclusive OR (XOR) gates 408-0 through 408-2 (collectively XOR gates 408), and inverters 410-0 through 410-2 (collectively inverters 410). Inputs of the inverters 410-0 through 410-2 can respectively receive the test result signals I0 through I2. Inputs a1, a2, and a3 of the adder 404 can be coupled to outputs of the inverters 410-0, 410-1, and 410-2, respectively. Inputs a1, a2, and a3 of the adder 402 can receive the test result signals I0, I1, and I2, respectively. Outputs b1 and b2 of the adder 402 can be coupled to inputs a1 and a2 of the comparator 406. Outputs b1 and b2 of the adder 404 can be coupled to inputs a3 and a4 of the comparator 406. Output b1 of the comparator can be coupled to an input of each of the XOR gates 408. Other inputs of the XOR gates 408-0, 408-1, and 408-2 can receive the test result signals I0, I1, and I2, respectively. Outputs of the XOR gates 408-0, 408-1, and 408-2 can provide the output signals O0, O1, and O2, respectively. In the present example, the adder 402 and the adder 404 can be three-bit adders that produce a two bit binary output. The comparator 406 can be a two-bit binary comparator with a single bit output.

In operation, the adder 402 can effectively count the number of logic '1' values of the test result signals I0-I2, and produce a binary result indicative of such count. The adder 402 can effectively count the number of logic '0' values of the test result signals I0-I2, and produce a binary result indicative of such count. The comparator 406 can compare the count of logic '1' values with the count of logic '0' values. If there are more logic '1' values than logic '0' values (logic '1' values are the majority), the comparator 406 can produce an output having a logic '1' value. That is, the voting logic 304 may vote a logic '1' value as the correct logic value of the test result signals. If there are more logic '0' values than logic '1' values (logic '0' values are the majority), the comparator 406 can produce an output having a logic '0' value. That is, the voting logic 304 can vote a logic '0' value as the correct logic value of the test result signals. The XOR gates 408 may determine if the test result signals I0-I2 have the correct logic value as determined by the comparator 406. If any of the test result signals I0-I2 have the correct logic value, the corresponding XOR gate 408-0 through 408-2 can produce a logic '0' value. If any of the test result signals I0-I2 have the incorrect logic value, the corresponding XOR gate 408-0 through 408-2 can produce a logic '1' value. That is, an output signal having a logic '1' value can indicate an error for the corresponding device on the particular pin. Conversely, an output signal having a logic '0' value can indicate no error for the corresponding device on the particular pin.

The logic truth table for the adders 402 and 404 is:

| Truth Table For Adders | | | | |
| --- | --- | --- | --- | --- |
| a1 | a2 | a3 | b1 | b2 |
| 0 | 0 | 0 | 0 | 0 |
| 1 | 0 | 0 | 1 | 0 |
| 0 | 1 | 0 | 1 | 0 |
| 1 | 1 | 0 | 0 | 1 |
| 0 | 0 | 1 | 1 | 0 |
| 1 | 0 | 1 | 0 | 1 |
| 0 | 1 | 1 | 0 | 1 |
| 1 | 1 | 1 | 1 | 1 |

The logic truth table for the comparator 406 is:

| Truth Table for Comparator | | | | |
|---|---|---|---|---|
| a1 | a2 | a3 | a4 | b1 |
| 0 | 0 | 1 | 1 | 0 |
| 0 | 1 | 1 | 0 | 1 |
| 1 | 0 | 0 | 1 | 0 |
| 1 | 1 | 0 | 0 | 1 |

The combinatorial logic shown in FIG. 4 and the above-described truth tables are merely exemplary, and the functionality of the voting logic 304 described above can be implemented using a myriad of combinatorial logic configurations.

Figure 5:
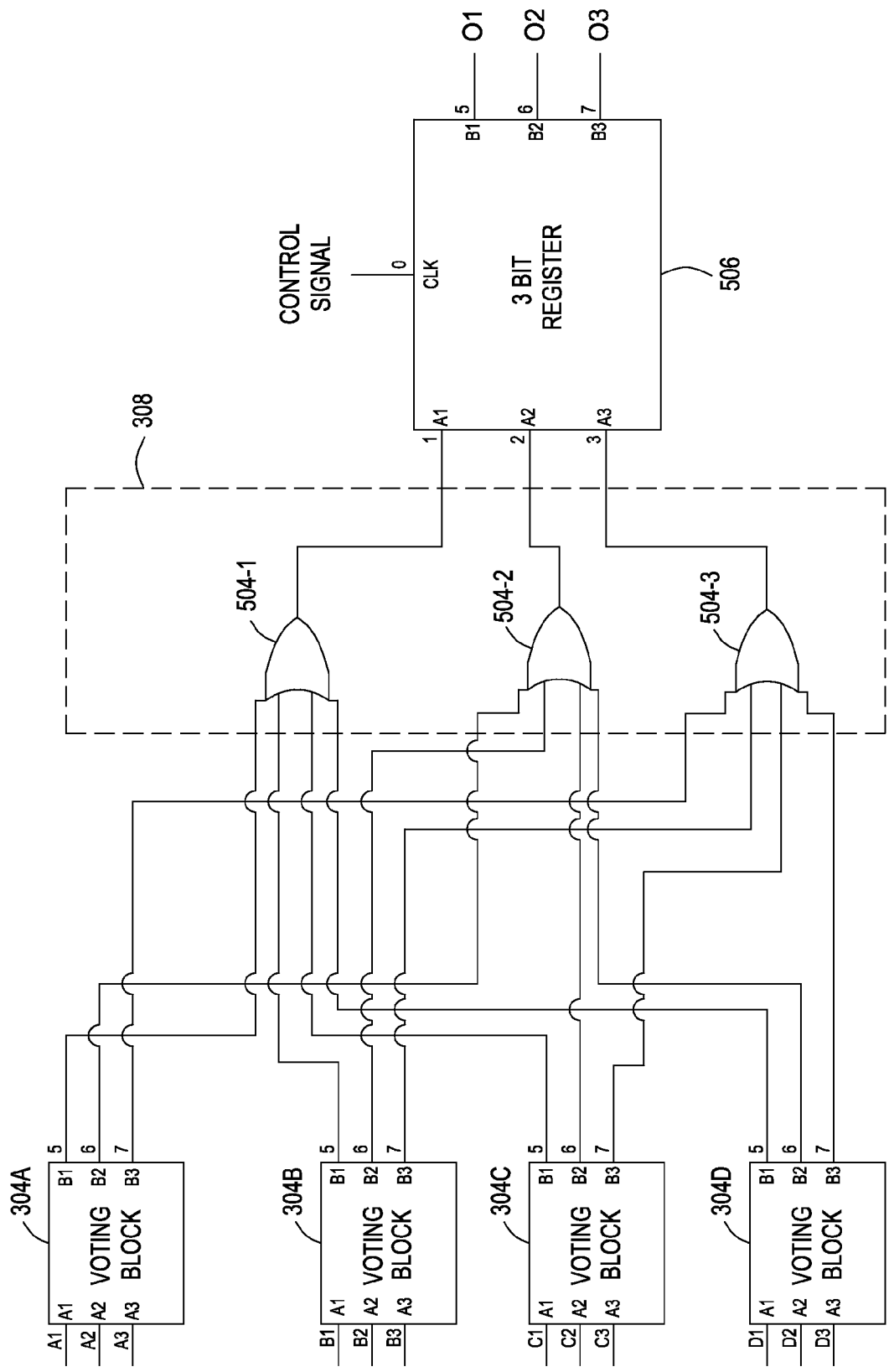
FIG. 5 is a block diagram depicting combining logic according to some embodiments of the invention.

FIG. 5 is a block diagram depicting the combining logic 308 according to some embodiments of the invention. For purposes of clarity by example, the combining logic 308 can accept output sets from four different TRE circuits 206, which correspond to four pins A through D. In addition, each output set from the four TRE circuits 206 corresponds to three devices 208, which in turn generate three test result signals per pin designated 1 through 3. Voting logic 304A, 304B, 304C, and 304D of the respective four TRE circuits 206 are shown. Inputs of the voting logic 304A can receive test result signals A1, A2, and A3 for pin A across devices 1 through 3. Inputs of the voting logic 304B can receive test result signals B1, B2, and B3 for pin B across devices 1 through 3. Inputs of the voting logic 304C can receive test result signals C1, C2, and C3 for pin C across devices 1 through 3. Inputs of the voting logic 304D can receive test result signals D1, D2, and D3 for pin D across devices 1 through 3.

In this non-limiting embodiment, the combining logic 308 can include OR gates 504-1, 504-2, and 504-3 (collectively 504). Each of the OR gates 504 can include four inputs. Three outputs of the voting logic 304A may be respectively coupled to first inputs of OR gates 504-1 through 504-3. Three outputs of the voting logic 304B may be respectively coupled to second inputs of OR gates 504-1 through 504-3. Three outputs of the voting logic 304C may be respectively coupled to third inputs of OR gates 504-1 through 504-3. Three outputs of the voting logic 304D may be respectively coupled to fourth inputs of OR gates 504-1 through 504-3.

A register 506 is shown, which can be part of the memory 306 in a TRE circuit or part of another memory. The register 506 may include three data inputs, a clock input, and three data outputs. An output of the OR gate 504-1 can be coupled to a first input of the register 506. An output of the OR gate 504-2 can be coupled to a second input of the register 506. An output of the OR gate 504-3 can be coupled to a third input of the register 506. The clock input of the register 506 can receive a control signal (e.g., the control signal in a TRE circuit). The outputs of the register 506 can provide error signals 01, 02, and 03, respectively corresponding to devices 1, 2, and 3 in the present example.

In operation, each of the voting logic 304A through 304B can operate substantially as described above. The OR gate 504-1 corresponds to the device 1, the OR gate 504-2 corresponds to the device 2, and the OR gate 504-3 corresponds to the device 3 in the present example. The OR gate 504-1 can sample the output signals of the voting logic 304A through 304B to detect an error in one or more of the pins A through D of the device 1. If any of such output signals has a logic '1' value (indicating a failure), the OR gate 504-1 can produce an output with a logic '1' value for the device 1. The OR gate 504-2 can sample the output signals of the voting logic 304A through 304B to detect an error in one or more of the pins A through D of the device 2. If any of such output signals has a logic '1' value (indicating a failure), the OR gate 504-2 can produce an output with a logic '1' value for the device 2. The OR gate 504-3 can sample the output signals of the voting logic 304A through 304B to detect an error in one or more of the pins A through D of the device 3. If any of such output signals has a logic '1' value (indicating a failure), the OR gate 504-3 can produce an output with a logic '1' value for the device 3. The register 506 can latch to logic values of the outputs of the OR gates 504 in response to assertion of the control signal. In this manner, the register 504 stores a logic state for each of the devices 1 through 3 that indicates if any of the pins A through D have failed. The register 506 can then be read by the tester 202.

The register 506 is just one example of a memory implementation and various implementations of the memory, including those described above, can be employed. In addition, the combining logic 308 can be implemented using different combinatorial logic to achieve the functionality described above. Furthermore, the combining logic 308 can be configured to process more or less than four pins for more or less than three devices.

Figure 6:
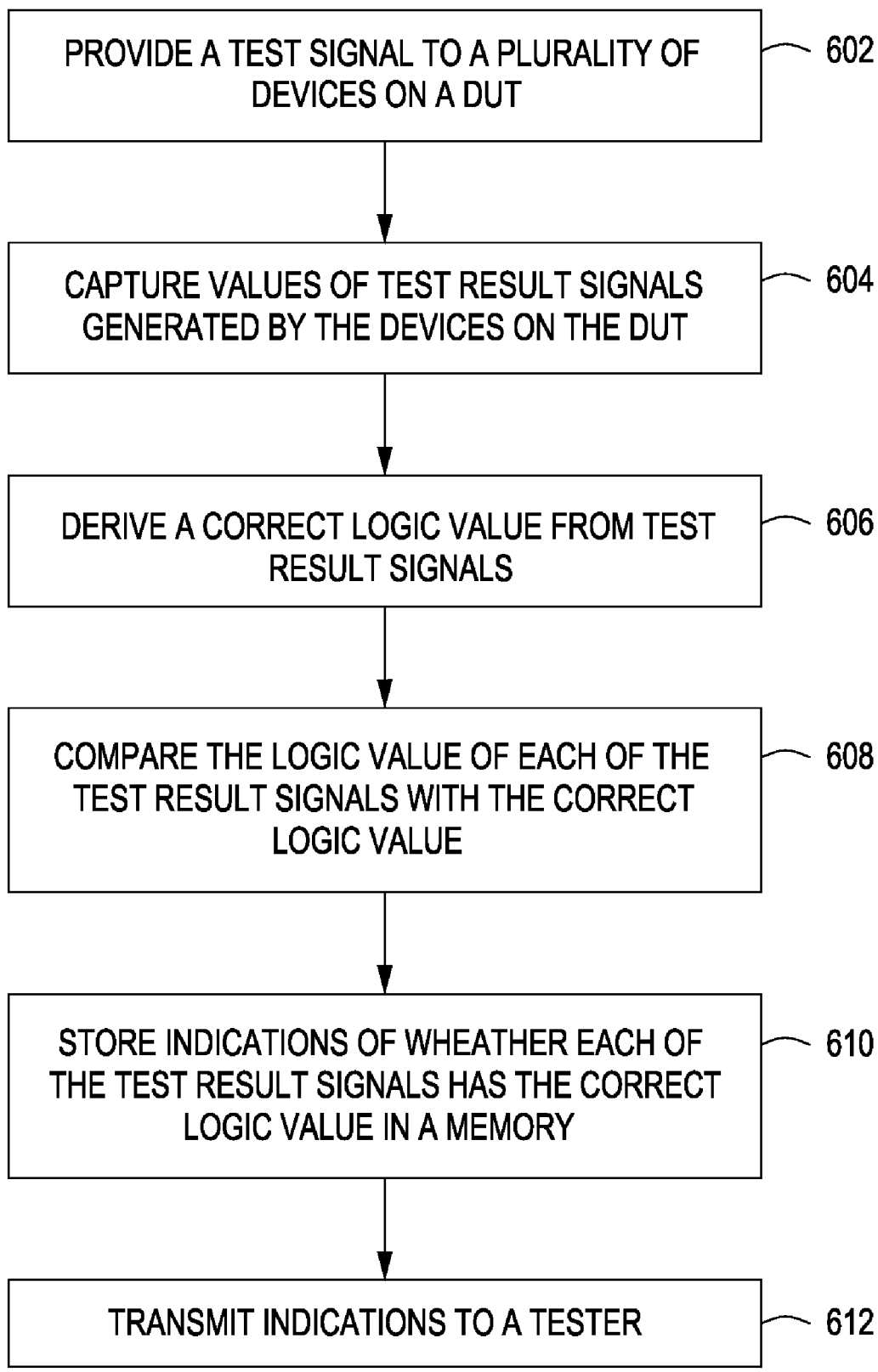
FIG. 6 is a flow diagram depicting a method of testing a semiconductor device according to some embodiments of the invention.

FIG. 6 is a flow diagram depicting a method 600 of testing a semiconductor device according to some embodiments of the invention. The method 600 can begin with providing a test signal to a plurality of devices on a DUT (602). Values of test result signals generated by the devices on the DUT can be captured (604). A correct logic value can be derived from the test result signals (606). In some embodiments, a logic value of a majority of the test result signals can be voted as a correct logic value. A logic value of each of the test result signals can be compared with the correct logic value (608). Indications of whether each of the test result signals has the correct logic value can be stored in a memory (610). The indications can be transmitted to a tester (612).

The method 600 can be performed for each of a plurality of pins of the devices on the DUT. For example, the method 600 can be performed by the OP logic 210 associated with each of the TRE circuits 206-1 through 206-M.

While the foregoing is directed to embodiments of the present invention, other and further embodiments of the invention may be devised without departing from the basic scope thereof, and the scope thereof is determined by the claims that follow.

The invention claimed is:

1. Apparatus for interfacing a tester and a semiconductor device under test (DUT), comprising:
    test probes configured to make temporary electrical contact with the DUT;
    connectors configured to connect to test channels from the tester;
    test resource extension circuitry configured to provide N number of test signals received through the connectors from the tester to K number of the test probes, wherein K is greater than N:
    output processing logic configured to receive from the test probes test result signals generated by the DUT in response to the test signals, the output processing logic voting a logic value of a majority of the test result signals as a correct logic value; memory configured to store indications of whether each of the test result signals has the correct logic value.

2. The apparatus of claim 1, wherein the output processing logic includes voting logic configured to establish the correct logic value responsive to the test result signals and to compare each of the test result signals with the correct logic value to produce the indications.

3. Apparatus for interfacing a tester and a semiconductor device under test (DUT), comprising:
output processing logic configured to receive test result signals from the DUT responsive to testing by the tester, the output processing logic voting a logic value of a majority of the test result signals as a correct logic value;
memory configured to store indications of whether each of the test result signals has the correct logic value;
wherein the output processing logic includes voting logic configured to establish the correct logic value responsive to the test result signals and to compare each of the test result signals with the correct logic value to produce the indications; and wherein the voting logic comprises:
a first adder configured to produce a first sum of logic '1' values in the test result signals;
a second adder configured to produce a second sum of logic '0' values in the test result signals; and
a comparator configured to compare the first sum and the second sum and produce the correct logic value.

4. The apparatus of claim 3, wherein the voting logic comprises: exclusive OR gates configured to compare the test result signals with the correct logic value as produced by the comparator.

5. The apparatus of claim 1, wherein the memory is coupled to at least one of the test channels for uploading the indications to the tester.

6. The apparatus of claim 5, wherein the indications comprise less data than the test result signals so as to reduce the number of test channels required by the tester.

7. The apparatus of claim 1, wherein the output processing logic further comprises:
voting logic configured to establish the correct logic value responsive to the test result signals and to compare each of the test result signals with the correct logic value to produce a set of output signals; and
combining logic configured to combine the set of output signals and at least one additional set of output signals from at least one additional voting logic to produce the indications.

8. The apparatus of claim 1, wherein the memory is configured to store the indications in response to a control signal from the tester.

9. The apparatus of claim 1, wherein, the test channels only carry the test signals to perform the testing and the indications produced as a result of the testing to the exclusion of providing the correct logic value so as to reduce the number of test channels required by the tester.

10. A test system for testing a semiconductor device under test (DUT), comprising:
test instruments having a tester;
a probe card assembly having test probes configured to contact devices on the DUT;
test resource extension circuitry configured to provide N number of test signals to K number of the test probes in contact with K number of pins of the DUT;
output processing logic configured to receive test result signals from groups of pins of the DUT output by the DUT in response to the test signals, the output processing logic configured to vote a logic value of a majority of the test result signals for each group of the pins as a correct logic value; and
memory configured to store indications of whether each of the test result signals for each group of the pins has the correct logic value.

11. The test system of claim 10, further comprising:
circuits configured to interface the tester and the plurality of the devices on the DUT, each circuit interfacing with a respective one of the groups of pins;
wherein the output processing logic includes voting logic disposed in each of the circuits; and
wherein the memory includes a memory circuit disposed in each of the circuits.

12. The test system of claim 11, further comprising, for each of the circuits:
a first test channel, coupling the tester to such circuit, configured to provide a test signal; and
at least one additional test channel, coupling the tester to the memory circuit in such circuit, configured to provide indications stored in the memory circuit to the tester.

13. The test system of claim 12, wherein the indications provided to the tester comprise less data than the test result signals received from the DUT so as to reduce the number of test channels on the probe card assembly.

14. The test system of claim 11, further comprising, for each of the circuits:
a second test channel, coupling the tester to the memory circuit in such circuit, configured to provide a control signal to control the memory circuit in such circuit.

15. The test system of claim 11, further comprising:
combining logic configured to receive outputs from the voting logic in a selected plurality of the circuits and to combine such outputs to produce at least a portion of the indications.

16. A test system for testing a semiconductor device under test (DUT), comprising:
test instruments having a tester;
a probe card assembly having test probes configured to contact devices on the DUT;
output processing logic configured to receive test result signals from groups of pins of the DUT responsive to testing by the tester, the output processing logic configured to vote a logic value of a majority of the test result signals for each group of the pins as a correct logic value;
memory configured to store indications of whether each of the test result signals for each group of the pins has the correct logic value; and
circuits configured to interface the tester and the plurality of the devices on the DUT, each circuit interfacing with a respective one of the groups of pins,
wherein the output processing logic includes voting logic disposed in each of the circuits,
wherein the memory includes a memory circuit disposed in each of the circuits, and
wherein the voting logic in each of the circuits comprises:
a first adder configured to produce a first sum of logic '1' values in the test result signals on the group of pins interfacing such circuit;
a second adder configured to produce a second sum of logic '0' values in the test result signals on the group of pins interfacing such circuit; and
a comparator configured to compare the first sum and the second sum and produce the correct logic value.

17. The test system of claim 16, wherein the voting logic in each of the circuits comprises:
exclusive OR gates configured to compare the test result signals on the group of pins interfacing such circuit with the correct logic value as produced by the comparator.

18. The test system of claim 10, wherein a portion of the output processing logic is implemented on the DUT.

19. The test system of claim 10, further comprising:
test channels on the probe card assembly coupled between the tester and the DUT, the test channels only carrying test signals to perform the testing and the indications produced as a result of the testing to the exclusion of providing each correct logic value so as to reduce the number of test channels on the probe card assembly.

20. A method of testing a semiconductor device under test (DUT), comprising:
providing N number of test signals to the DUT through K number of probes of a probe card assembly in contact with the DUT;
capturing through the probes values of test result signals generated by the DUT in response to the test signals;
voting a logic value of a majority of the test result signals as a correct logic value;
comparing each of the values of the test result signals with the correct logic value; and
storing indications of whether each of the test result signals has the correct logic value in a memory disposed on the probe card assembly.

21. The method of claim 20, further comprising:
transmitting the indications to a tester.

22. The method of claim 21, wherein the indications transmitted to the tester comprise less data than the test result signals received from the DUT so as to reduce the number of test channels coupled to the tester.

23. The method of claim 20, wherein the act of voting comprises:
counting a number of logic '1' values in the test result signals;
defining a logic '1' value as the correct value in response to the number of logic '1' values being greater than a number of logic '0' values; and
defining a logic '0' value as the correct value in response to the number of logic '1' values being less than a number of logic '0' values.

24. A probe card assembly, comprising:
test probes configured to contact a semiconductor device under test (DUT);
connectors configured to connect to test channels from a tester configured to test the DUT;
test resource extension circuitry configured to provide N number of test signals received through the connectors from the tester to K number of the test probes, wherein K is greater than N;
output processing logic configured to receive test result signals from groups of pins of the DUT generated by the DUT in response to the test signals, the output processing logic configured to vote a logic value of a majority of the test result signals for each group of the pins as a correct logic value; and
memory configured to store indications of whether each of the test result signals for each group of the pins has the correct logic value.

25. The probe card assembly of claim 24, further comprising:
circuits coupled to the test probes, each circuit configured to interface with a respective one of the groups of pins;
wherein the output processing logic includes voting logic disposed in each of the circuits; and
wherein the memory includes a memory circuit disposed in each of the circuits.

26. The probe card assembly of claim 25, wherein the connectors include for each of the circuits:
a connector to a first test channel configured to provide a test signal; and
at least one additional connector to a test channel configured to carry indications stored in the memory circuit.

27. The probe card assembly of claim 26, wherein the indications comprise less data than the test result signals received from the DUT so as to reduce the number of test channels to which the connectors on the probe card assembly connect.

28. The probe card assembly of claim 24, wherein the test channels only carrying test signals to perform the testing and the indications produced as a result of the testing to the exclusion of providing each correct logic value so as to reduce the number of test channels to which the connectors on the probe card assembly connect.

29. The test system of claim 10, where a portion of the output processing logic is implemented on the probe card assembly.

30. The test system of claim 10, where a portion of the output processing logic is implemented on the tester.

* * * * *